(12) United States Patent
Summer

(10) Patent No.: US 7,132,877 B2
(45) Date of Patent: *Nov. 7, 2006

(54) RADIATION TOLERANT SOLID-STATE RELAY

(76) Inventor: Steven E. Summer, One Roned Rd., Shirley, NY (US) 11967

(*) Notice: Subject to any disclaimer, the term of this patent is extended or adjusted under 35 U.S.C. 154(b) by 21 days.

This patent is subject to a terminal disclaimer.

(21) Appl. No.: 10/963,957

(22) Filed: Oct. 12, 2004

(65) Prior Publication Data

US 2006/0076999 A1    Apr. 13, 2006

(51) Int. Cl.
*H03K 17/687* (2006.01)
(52) U.S. Cl. ..................... 327/427; 327/389
(58) Field of Classification Search ............. 327/378, 327/389, 427
See application file for complete search history.

(56) References Cited

U.S. PATENT DOCUMENTS 3,836,836 A    9/1974  Cowett, Jr.
4,603,269 A *  7/1986  Hochstein ............... 327/432
4,665,316 A *  5/1987  Hodges ................... 250/551
4,710,645 A * 12/1987  Doittau et al. ........... 307/115
4,804,866 A *  2/1989  Akiyama ................. 307/117
6,952,120 B1* 10/2005  Rahman et al. .......... 327/108
6,982,883 B1*  1/2006  Summer ................ 363/21.12

* cited by examiner

*Primary Examiner*—Jeffrey Zweizig
(74) *Attorney, Agent, or Firm*—Stephen E. FeldmanPC

(57) ABSTRACT

The present invention provides a radiation-tolerant-solid-state-relay without radiation-hardened parts. A p-channel MOSFET provides power-switching functionality. In further detail, the solid-state-relay comprises a bias section, a control section, and a power-switch section. The bias section provides a voltage bias to the control section, the control section provides a control voltage to the power switch section as a function of the voltage bias, and the power switch section provides a switching voltage to the P-channel MOSFET as a function of the control voltage.

9 Claims, 1 Drawing Sheet

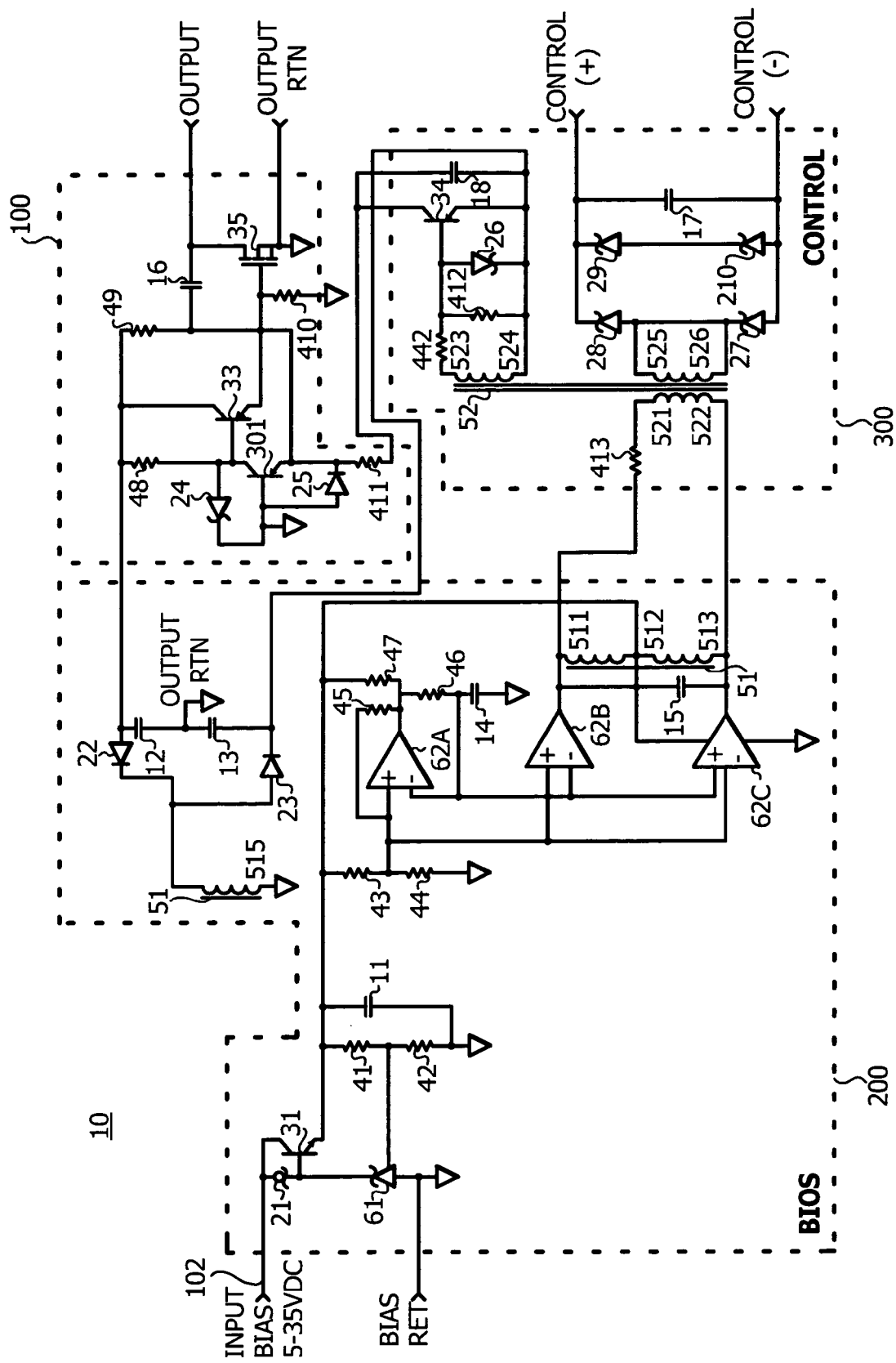

RADIATION TOLERANT SOLID-STATE RELAY

FIELD OF THE INVENTION

The present invention deals with electrical components and more specifically, a radiation-tolerant solid-state relay without radiation-hardened parts.

BACKGROUND OF THE INVENTION

Solid-state relays perform functions similar to electromagnetic relays, but are more reliable, since there are no moving parts. Since the turn on and turn off times of a solid-state relay are controllable, the solid-state relay also minimizes the generation of switching transients.

A preferred semiconductor device for power control in a solid-state relay is the insulated gate FET (Field Effect Transistor) because of its high power gain. FETs used for power switching use are usually enhancement mode types. This means that they are normally non-conducting. When a gate voltage above a threshold is applied, the FET becomes conducting. FETs are available in two gate polarities; N channel and P channel.

In an FET, current flows along a semiconductor path called the channel. At one end of the channel, there is a source electrode, and at the other end, a drain electrode. The physical diameter of the channel is fixed, but its effective electrical diameter is changed by applying voltage to a gate electrode. The conductivity of the FET depends, at any given time, on the electrical diameter of the channel. A small change in gate voltage can cause a large variation in current from the source to the drain. In this way, the FET switches current on or off.

Typically, FETs used for power switching are enhancement mode types, that is, they are normally non-conducting. When a gate voltage above a certain threshold is applied, the FET becomes conducting. Such FETs are used to control current flow and are available in two gate polarities; N channel and P channel.

Among many applications, solid-state relays are used in spacecraft, satellites and in high energy physics instrumentation where they are subjected to many forms of radiation damage. When electrical components are exposed to radiation, they behave differently. For example, when an N channel FET is exposed to relatively low radiation levels, the gate threshold voltage ultimately falls close to zero. In this condition, the FET conducts current with little or no applied gate voltage. In other words, the FET is uncontrollable because the current running through the channel cannot be shut off.

Solid-state relays designed for general purpose use are typically constructed with N channel FETs because, for any given die size transistor, the N channel FET has a lower on resistance than a correspondingly sized P channel FET.

To use electrical components in high radiation environments, they are radiation-hardened to withstand the damage caused by radiation. The radiation hardening process usually involves removing or adding some specific element or ions to the materials used for making the components. Being radiation hardened, the gate threshold voltage experiences minimal change after exposure to radiation. One method for chemically radiation hardening electronic components is disclosed in U.S. Pat. No. 3,836,836 to Cowett, Jr. (Cowett).

Radiation hardened components, however, have limited sources, are expensive and take a long time to produce, creating higher prices and longer delivery times for the radiation tolerant circuits that incorporate the hardened materials. It is desireable, therefore, to provide electrical components with ordinary (non-hardened) materials that can function when exposed to radiation.

SUMMARY OF THE INVENTION

The present invention provides a radiation-tolerant-solid-state-relay without radiation-hardened parts. A p-channel MOSFET provides power-switching functionality. In further detail, the solid-state-relay comprises a bias section, a control section, and a power-switch section. The bias section provides a voltage bias to the control section, the control section provides a control voltage to the power switch section as a function of the voltage bias, and the power switch section provides a switching voltage to the P-channel MOSFET as a function of the control voltage.

BRIEF DESCRIPTION OF THE DRAWINGS

The FIGURE is a circuit diagram of a solid-state relay in accordance with an embodiment of the present invention.

DETAILED DESCRIPTION

In accordance with a preferred embodiment of the present invention, the gate drive signal should be high enough to saturate the drain to source channel. It should not, however, be so high that the gate to source breakdown voltage rating of the FET is exceeded. Preferably, the FET operates close to its maximum gate voltage signal. Higher signals can handle higher radiation levels, allowing the FET to function across a larger range of radiation exposure.

The FIGURE is a schematic diagram of a radiation-tolerant solid-state relay generally indicated by reference numeral 10 in accordance with a preferred embodiment of the present invention. This circuit example operates from a voltage source 102 to 50 VDC, but nominally 28 VDC. It may, however, be readily scaled for different bus voltages.

The circuit 10 includes three galvanically isolated sections, the bias section 200, the control section 300 and the power switching section 100.

The bias section 200 provides transformer isolated power, or a voltage bias, to the other two sections. Input voltage 102, in the range of 5 to 35 VDC, is applied to the collector of NPN bipolar-emitter-follower transistor 31, as well as a constant-current diode 21, thus setting an operation point for programmable-shunt-regulator IC 61. The base of transistor 31 is connected to the other end of the constant-current diode 21 as well as to the cathode of the regulator IC 61.

A first regulating resistor 41 and second regulating resistor 42 provide a voltage divider across the reference terminal of the regulator IC 61. The conduction of the regulator IC 61 seeks to maintain a nominal 2.5 VDC level. Therefore, the base voltage of the transistor 31 is controlled by the IC 61 so that the emitter voltage of the transistor 31 stabilizes at a voltage of approximately 4.6 VDC.

As the bias voltage varies over a range of 5 VDC to 35 VDC, the voltage on the transistor's 31 emitter is relatively stable at 4.6 VDC. This voltage is decoupled by an internal-bias-power-supply-filter capacitor 11.

A quad comparator IC 62 has four comparator sections, but only three of its four sections are used. In this particular example, the first comparator section 62A is connected as an astable multivibrator. The non-inverting terminal of the first comparator 62A is connected to a resistor network with two equal value resistors, a first 43 and second 44 center-tapping resistor that center-tap the bias voltage applied to the first comparator 62A. and a positive-feedback-resistor 45. The first 43 and second 44 center-tapping resistors and the positive-feedback resistor 45 each preferably have the same resistance value.

The output of the first comparator 62A is connected to one end of the resistor 45. A collector-pull-up resistor 47 is included because the output of 62A is an open collector configuration. Osciillator-frequency-timing resistor 46 is connected between the output of the first comparator 62A and an internal-bias-power-supply-timing capacitor 14. The timing capacitor 14 is also connected to the inverting input of the first section 62A.

In operation, the voltage on the timing capacitor 14 is always "chasing" the voltage derived by the first 43 and second 44 center-tapping resistor 43, to center-tap the bias voltage applied to the first comparator 62A and the feedback resistor 45. When the two voltages are equal, the comparator 62A changes state. In the present example, the circuit oscillates at approximately 200 kHz. The duty cycle of the oscillator is between 20–70%, preferably between 30–60% and most preferably about 50%.

The inputs of the second 62B and third 62C comparators are connected in parallel with the input of the first comparator 62A. In this particular example, the input pins of the second comparator 62B and third comparator 62C are connected in opposite polarity to each other, making their outputs out of phase, switching at about 200 kHz.

The comparator outputs drive the center tapped primary of a power-switch-section-voltage-isolating-bias transformer 51 (pins 511, 512 and 513). Spike-filtering capacitor 15 limits the spike voltage on the output of the second 62B and third 62C comparator sections.

The waveform across the primary winding (pins 511 and 513) of the transformer 51 is an approximate 200 kHz square wave with an amplitude of approximately 8 volts peak to peak.

The secondary winding of the transformer 51 appears at pins 514 and 515. The amplitude of the secondary winding voltage is approximately 42 volts peak to peak. Pin 515 of the transformer of 51 is referenced to the power switching ground.

The control section 300 provides a control voltage to the power switching section 100 as a function of the voltage bias provided by the bias section 200.

The primary winding of the control transformer 52 that isolates the control pins, bias supply and power switch section is connected across the primary winding of the bias transformer 51 through current-limiting resistor 413. The secondary winding of the transformer 52 (pins 525 and 526) is connected to a diode bridge of four diodes 27, 28, 29 and 210. The open circuit voltage of the diode bridge is filtered by a spike-filtering capacitor 17.

The second winding of the control transformer 52 (pins 523 and 524) is connected to the emitter of an NPN-bipolar-control transistor 34. A reverse-voltage-limiting diode 26 limits the reverse voltage applied to the transistor's 34 base emitter junction.

Pin 524 of the control transformer 52 is referenced to the power switch ground. Pins 521 and 522 are referenced to the bias ground. Pins 525 and 526 are floating, not galvanically connected to either ground. Therefore, the control transformer 52 is a magnetically coupled device that allows isolation between the three isolated ground sections.

In operation, when the external control pins are open circuit, current from the control transformer 52 pins 523 and 524 cause the control transistor 34 to conduct on each half cycle. When the external control pins are shorted, current flowing into the transistor's 34 emitter is reduced. This reflected action controls the power switching stage.

The power switching section 100 provides a switching voltage to a p-channel MOSFET 35 as a function of the switching voltage from the control section 300.

Power to operate the power switching section is derived from the secondary winding of the transformer 51, pins 514 and 515. The voltage at pin 514 is rectified by a first 22 and second 23 peak-rectifier diode that establishes a bias voltage for the power switch section, filtered by a first 12 and second 13 power-switch-section-peak-filtering capacitor. The resultant voltage across the first and second power-switch-section-peak-filtering capacitor 12 and 13 is approximately +21VDC and −21 VDC respectively.

The active devices of the power switching section consists of a first 32, second 33, and third 34 PNP-bipolar-common-base-amplifier transistor and a P-Channel enhancement MOSFET 35.

The first-common-base-amplifier transistor 32 is a common base amplifier that provides a non-inverting stage of voltage gain. The collector load resistor for the transistor 32 is a collector-pull-up resistor 48. The base of the transistor 32 is connected to the power switching ground.

A reverse-voltage-limiting diode 25 limits the reverse voltage across the base emitter terminal of the transistor 32. A gate-to-source-voltage-limiting zener diode 24 for the MOSFET 35 limits the collector voltage of the transistor 32. In turn, the maximum gate voltage applied to the MOSFET 35 is also limited.

A gate-drive-voltage-buffer transistor 33 operates an emitter follower, lowering the impedance of the signal on the collector of the transistor 32.

A gate-to-source filter resistor 410 for transistor 35 is connected across the gate-source terminals of the P-Channel enhancement MOSFET 35 to lower gate impedance.

The P-Channel enhancement MOSFET 35 acts as an output switch transistor controlled by the action of PNP-bipolar transistor 34. When bias power is applied, the oscillator consisting of the first 62A, second 62B, and third 62C comparator sections and related components, starts. The resultant AC waveform is transmitted through the control transformer 52. Current-limiting resistor 414 and turn-on-bias-resistor 412 attenuate the AC voltage. Reverse-voltage-limiting diode 26 limits the reverse base-emitter voltage on the transistor 34. On half cycles, the base current flow to the transistor 34 saturates the collector-emitter terminals. Turn-on-rise-time capacitor 18 filters any high frequency currents at this point.

When the transistor 34 turns on, current flows from the positive bias at the anode of diode 23 through turn-on-bias-resistor 411 to the junction of output-timing capacitor 16, turn-off-bias resistor 49, turn-on-bias-resistor 411, reverse-voltage-limiting diode 25 and the emitter of the common-base-amplifier-PNP-bipolar transistor 32 to switch the transistor 32 off. This causes a forward bias of the transistor 32.

The resulting current flow through turn-on-bias-resistor 411 and the current flow through turn-off-bias resistor 49 are in the same direction. However, when the transistor 34 is on, the net current flow into the emitter of the transistor 32 causes it to saturate. Through the gate-drive-voltage-buffer transistor 33, the gate bias is removed from the MOSFET 35, in effect, turning the switch off.

Output-timing capacitor 16 is a timing capacitor which controls the rise and fall time of 35.

When the external control pins are shorted, the short circuit is reflected through the full-wave-diode bridge with a first 27, second 28, third 29, and fourth 210 full-wave diode through the control transformer 52 to the emitter of the PNP bipolar transistor 34. This causes the transistor 34 to turn off, removes the current flow from the turn-on-bias-resistor 411, and allows an increased effect for the current flow through turn-off-bias resistor 49 to switch transistor 32 off. The transistor's 32 collector is pulled negative through a collector-pull-up resistor 48. The transistor's 32 collector voltage is limited by a gate-to-source-voltage-limiting zener diode 24 which protects the gate of the p-channel MOSFET 35 against excessive gate-source voltage. The transistor 32 collector voltage is fed through the emitter follower of the gate-drive-voltage-buffer transistor 33 to the gate of the MOSFET 35. This high amplitude gate voltage causes the MOSFET 35 to turn on.

Therefore, the solid-state relay has a normally off function, and turns on when the control pins are shorted to each other.

In the preceding specification, the invention has been described with reference to specific exemplary embodiments thereof. It will however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed is:

1. A radiation-tolerant-solid-state relay with a non-hardened P-channel MOSFET to provide a controlled electrical response with exposure to radiation, the solid-state relay comprising:
   an input;
   an output;
   a non-hardened-p-channel MOSFET;
   wherein the input provides a predetermined current to the p-channel MOSFET and the p-channel MOSFET produces the output as a function of the predetermined current.

2. The radiation-tolerant-solid-state relay of claim 1 wherein the input further comprises a bias section.

3. The radiation-tolerant-solid-state relay of claim 2 further comprising a control section.

4. The radiation-tolerant-solid-state relay of claim 3 further comprising a power switching section.

5. The radiation-tolerant-solid-state relay of claim 4 wherein:
   the bias section provides a voltage bias to the control section;
   the control section provides a control voltage to the power switch section as a function of the voltage bias;
   the power switch section provides a switching voltage to the P-channel MOSFET as a function of the control voltage.

6. The radiation-tolerant-solid-state relay of claim 5 wherein the bias section further comprises:
   an input;
   a comparator; and
   a bias transformer;
   wherein the input feeds the comparator and the comparator feeds the bias transformer to produce the voltage bias.

7. The radiation-tolerant-solid-state relay of claim 6 wherein the control section further comprises a control transformer that accepts the voltage bias and produces the control voltage.

8. A radiation-tolerant-solid-state relay with a non-hardened P-channel MOSFET to provide a controlled electrical response with exposure to radiation, the solid-state relay comprising:
   an input, the input further comprising a bias section, the bias section further comprising an input, a comparator and a bias transformer;
   an output;
   a non-hardened-p-channel MOSFET;
   a control section; and
   a power switching section,
   wherein the input provides a predetermined current to the p-channel MOSFET and the p-channel MOSFET produces the output as a function of the predetermined current,
   wherein the bias section provides a voltage bias to the control section, and the control section provides a control voltage to the power switching section as a function of the voltage bias,
   wherein the power switch section provides a switching voltage to the P-channel MOSFET as a function of the control voltage, and
   wherein the input feeds the comparator and the comparator feeds the bias transformer to produce the voltage bias.

9. The radiation-tolerant-solid-state relay of claim 8 wherein the control section further comprises a control transformer that accepts the voltage bias and produces the control voltage.

* * * * *